(12) United States Patent
Joshi et al.

(10) Patent No.: US 10,522,498 B2
(45) Date of Patent: Dec. 31, 2019

(54) SYSTEMS OF BONDED SUBSTRATES AND METHODS FOR BONDING SUBSTRATES WITH BONDING LAYERS

(71) Applicant: Toyota Motor Engineering & Manufacturing North America, Inc., Erlanger, KY (US)

(72) Inventors: Shailesh N. Joshi, Ann Arbor, MI (US); Masao Noguchi, Ann Arbor, MI (US)

(73) Assignee: TOYOTA MOTOR ENGINEERING & MANUFACTURING NORTH AMERICA, INC., Plano, TX (US)

(*) Notice: Subject to any disclaimer, the term of this patent is extended or adjusted under 35 U.S.C. 154(b) by 162 days.

(21) Appl. No.: 15/598,776

(22) Filed: May 18, 2017

(65) Prior Publication Data
US 2017/0256516 A1 Sep. 7, 2017

Related U.S. Application Data

(62) Division of application No. 14/794,315, filed on Jul. 8, 2015, now Pat. No. 9,691,729.

(51) Int. Cl.
*H01L 23/367* (2006.01)
*H01L 23/00* (2006.01)
*B23K 1/00* (2006.01)

(52) U.S. Cl.
CPC ............ *H01L 24/32* (2013.01); *B23K 1/0016* (2013.01); *H01L 23/3675* (2013.01); *H01L 24/83* (2013.01); *H01L 2224/29111* (2013.01); *H01L 2224/32245* (2013.01); *H01L 2224/831* (2013.01); *H01L 2224/832* (2013.01); *H01L 2224/83895* (2013.01); *H01L 2924/01013* (2013.01); *H01L 2924/01028* (2013.01); *H01L 2924/01029* (2013.01); *H01L 2924/2064* (2013.01)

(58) Field of Classification Search
CPC ...... H01L 23/3675; H01L 24/32; H01L 24/83
See application file for complete search history.

(56) References Cited

U.S. PATENT DOCUMENTS

| | | | |
|---|---|---|---|
| 6,000,243 A | 12/1999 | Davidson et al. | |
| 7,238,255 B2 | 7/2007 | Derand et al. | |
| 2002/0053399 A1 | 5/2002 | Soane et al. | |
| 2002/0074520 A1* | 6/2002 | Yu | B29C 65/56 |
| | | | 250/492.21 |

(Continued)

OTHER PUBLICATIONS

Office Action filed in U.S. Appl. No. 14/794,315 dated Jul. 28, 2016.

*Primary Examiner* — Joseph M Galvin, III
(74) *Attorney, Agent, or Firm* — Dinsmore & Shohl LLP

(57) ABSTRACT

A system of bonded substrates may include a first substrate, a second substrate, and a bonding layer. The first substrate may include a bonding surface, wherein a geometry of the bonding surface of the first substrate includes a plurality of microchannels. The second substrate may include a complementary bonding surface. The bonding layer may be positioned between the first substrate and the second substrate, wherein the bonding layer may fill the microchannels of the first substrate and may contact substantially the entire bonding surface of the first substrate. The bonding layer may include a metal.

20 Claims, 6 Drawing Sheets

(56) References Cited

U.S. PATENT DOCUMENTS

2008/0157353 A1\* 7/2008 Watanabe ........... H01L 23/3128
　　　　　　　　　　　　　　　　　　　　　　　257/734
2010/0152699 A1　 6/2010 Ferrari et al.
2011/0151272 A1　 6/2011 Brennen et al.
2015/0348863 A1\* 12/2015 Du ..................... H01L 23/3128
　　　　　　　　　　　　　　　　　　　　　　　257/737

\* cited by examiner

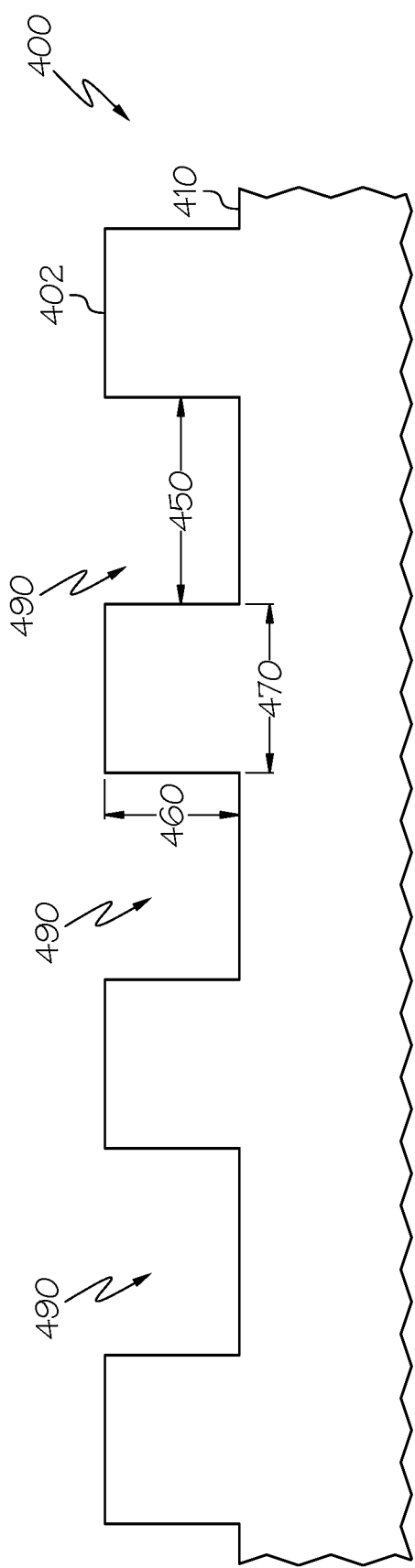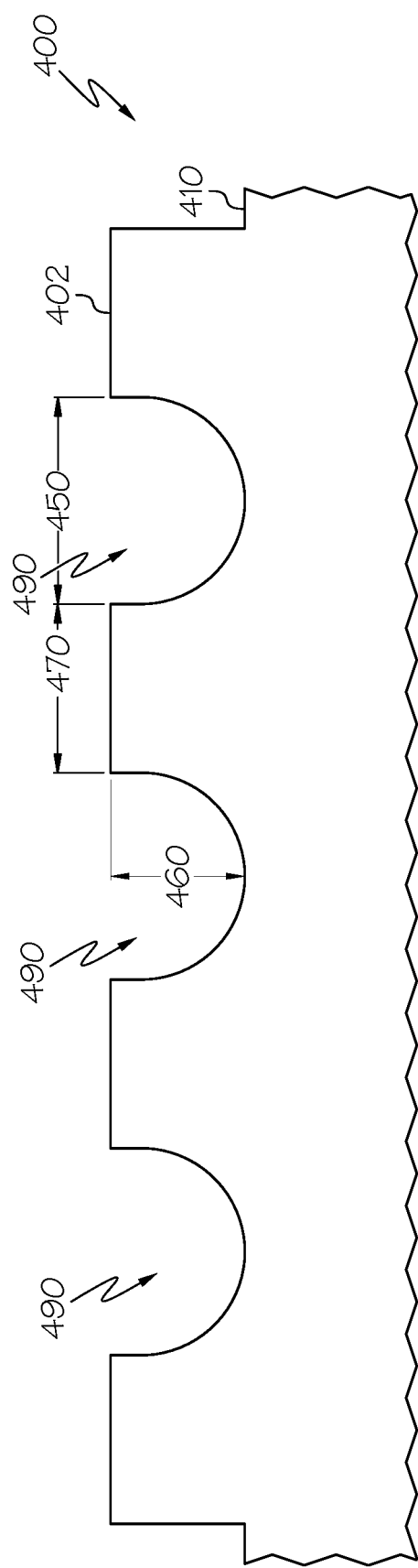

SYSTEMS OF BONDED SUBSTRATES AND METHODS FOR BONDING SUBSTRATES WITH BONDING LAYERS

CROSS-REFERENCE TO RELATED APPLICATIONS

The present application is a divisional application of and claims priority to U.S. patent application Ser. No. 14/794,315 filed Jul. 8, 2015 and entitled "Systems of Bonded Substrates and Methods for Bonding Substrates with Bonding Layers," which is incorporated by reference herein.

TECHNICAL FIELD

The present specification generally relates to the bonding of substrates and, more specifically, to the bonding of substrates exposed to thermal cycling.

BACKGROUND

Components of electrical devices which operate at elevated temperatures may need to be bonded with one another. For example, power semiconductor devices, such as those fabricated from silicon carbide, may be designed to operate at very high operating temperatures (e.g., greater than 250° C.). Such power semiconductor devices may be bonded to a cooling device, such as heat sink or a liquid cooling assembly. The cooling device removes heat from the power semiconductor to ensure that it operates at a temperature that is below its maximum operating temperature. The bonding layer that bonds the power semiconductor device to the cooling device must be able to withstand the high operating temperatures of the power semiconductor device. However, conventional bonding techniques may be difficult and/or costly, and may not have sufficient bond strength over thermal cycling. For example, prolonged heating times for bonding and the use of wetting agents on the substrates may by be required according to conventional bonding techniques.

Accordingly, a need exists for alternative methods for bonding two substrates to one another.

SUMMARY

In one embodiment, a first substrate may be bonded to a second substrate in a method that may comprise providing the first substrate, providing a second substrate, providing a bonding layer precursor, positioning the bonding layer precursor between the first substrate and the second substrate, and bonding the first substrate to the second substrate by heating the bonding layer precursor to form a bonding layer. The first substrate may comprise a bonding surface, and a geometry of the bonding surface of the first substrate may comprise a plurality of microchannels. The second substrate may comprise a complementary bonding surface and the bonding layer precursor may comprise a metal. The first surface of the bonding layer precursor may be in contact with at least a portion of the bonding surface of the first substrate, and the second surface of the bonding layer precursor may be in contact with at least a portion of the bonding surface of the second substrate. The bonding layer may fill the microchannels of the first substrate and may contact substantially the entire bonding surface of the first substrate.

In another embodiment, a system of bonded substrates may comprise a first substrate, a second substrate, and a bonding layer. The first substrate may comprise a bonding surface, wherein a geometry of the bonding surface of the first substrate may comprise a plurality of microchannels. The second substrate may comprise a complementary bonding surface. The bonding layer may be positioned between the first substrate and the second substrate, wherein the bonding layer may fill the microchannels of the first substrate and may contact substantially the entire bonding surface of the first substrate. The bonding layer may comprise a metal.

In yet another embodiment, a first substrate may be bonded to a second substrate in a method that may comprise providing the first substrate, providing a second substrate, providing a bonding layer precursor, positioning the bonding layer precursor between the first substrate and the second substrate, and bonding the first substrate to the second substrate by heating the bonding layer precursor to form a bonding layer. The first substrate may comprise a bonding surface, wherein a geometry of the bonding surface of the first substrate may comprise a plurality of microchannels having a depth from about 5 microns to about 10 microns. A material of the first substrate at the bonding surface may be chosen from aluminum, copper, nickel, or combinations thereof. The second substrate may comprise a complementary bonding surface, wherein a geometry of the bonding surface of the second substrate may comprise a plurality of microchannels having a depth from about 5 microns to about 10 microns. A material of the second substrate at the bonding surface may be chosen from aluminum, copper, nickel, or combinations thereof. The bonding layer precursor may be substantially planar and may comprise a first surface and a second surface, the distance between the first surface and second surface defining a thickness of the bonding layer precursor. The bonding layer precursor may comprise tin. The bonding layer precursor may be positioned between the first substrate and the second substrate, wherein the first surface of the bonding layer precursor may be in contact with at least a portion of the bonding surface of the first substrate, and the second surface of the bonding layer precursor may be in contact with at least a portion of the bonding surface of the second substrate. The bonding layer may fill the microchannels of the first substrate and the microchannels of the second substrate. The bonding layer may contact substantially the entire bonding surface of the first substrate and substantially the entire bonding surface of the second substrate.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 4 schematically depicts a cross-sectional side view of a substrate bonding surface comprising microchannels with rectangular cross-section, according to one or more embodiments shown and described herein;

FIG. 5 schematically depicts a cross-sectional side view of a substrate bonding surface comprising microchannels with curved cross-section, according to one or more embodiments shown and described herein;

DETAILED DESCRIPTION

Referring generally to the figures, embodiments of the present disclosure are directed to methods for bonding two or more substrates together with a thermally conductive bonding layer, and additionally, to the resulting bonded substrates. Generally, each of the substrates may comprise a substrate bonding surface which contacts a bonding layer that is positioned between and contacting the substrates. One or both of the substrate bonding surfaces may comprise a plurality of microchannels which may improve bonding strength and/or durability of the bond. During a bonding process, which may involve heating of at least a bonding layer precursor, the microchannels may promote capillary action between the solid substrates and the melted bonding layer precursor. Various embodiments of bonded substrate systems and methods for bonding substrates are described in detail herein.

Figure 1:
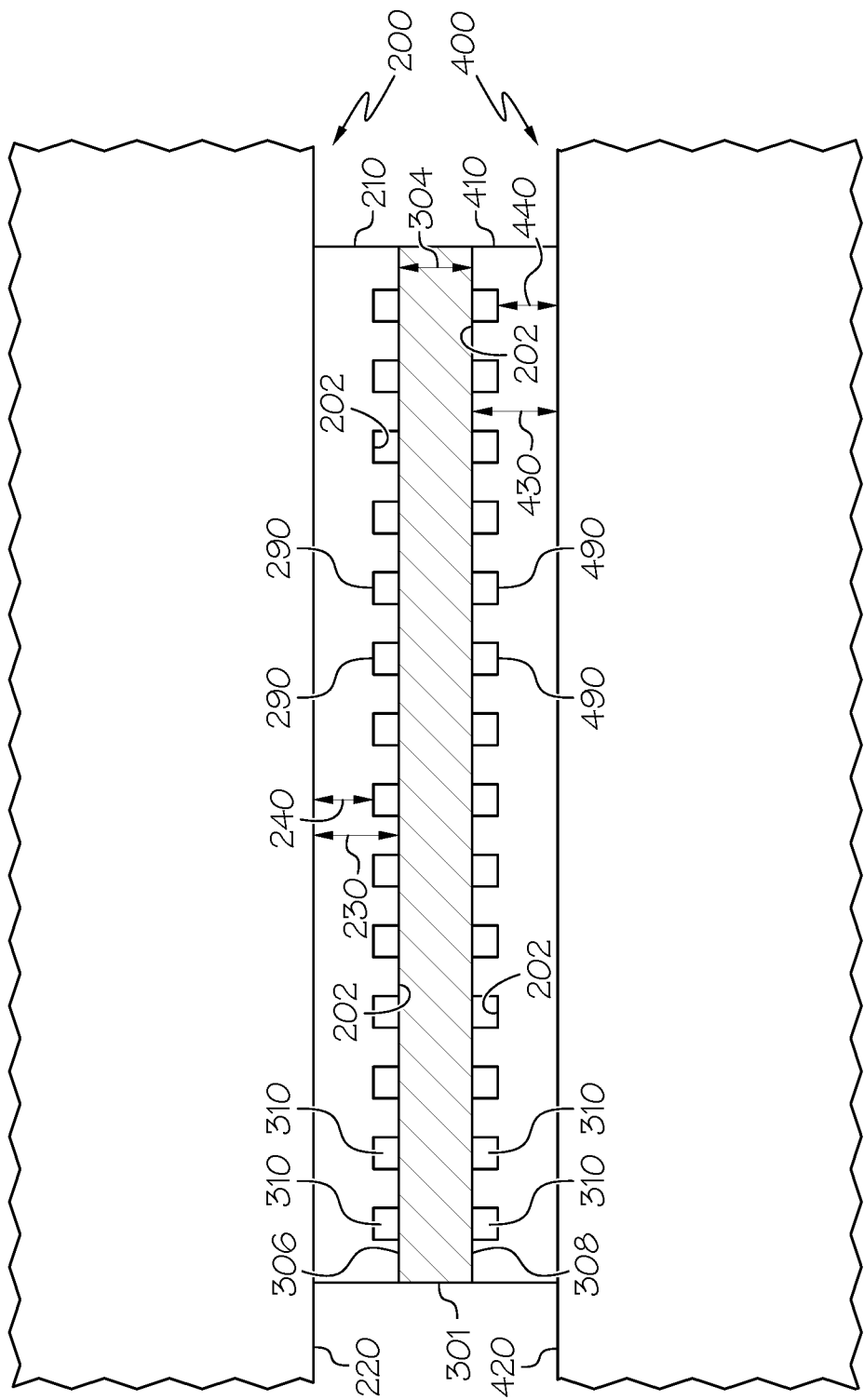
FIG. 1 schematically depicts a cross-sectional side view of two substrates and a bonding layer in a pre-bonded state, according to one or more embodiments shown and described herein.
Figure 2:
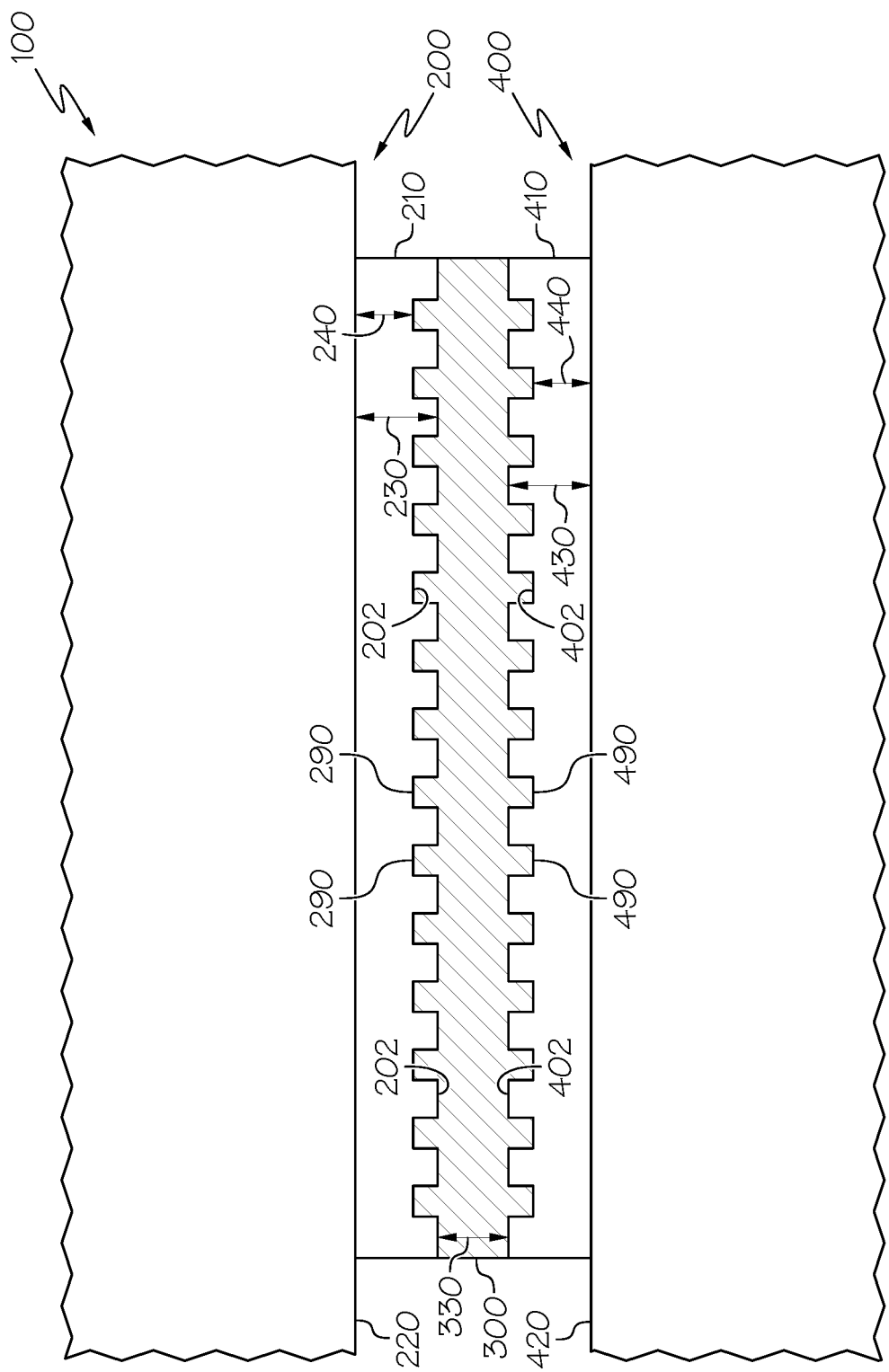
FIG. 2 schematically depicts a cross-sectional side view of two substrates bonded to one another with a bonding layer, according to one or more embodiments shown and described herein.

FIG. 1 generally depicts one embodiment of an upper substrate 200, a lower substrate 400, and a bonding layer precursor 301, such as a metallic foil, in a pre-bonded state. FIG. 2 generally depicts a system of bonded substrates 100 comprising an upper substrate 200 and a lower substrate 400 bonded to one another with a bonding layer 300 that is formed by heating of the bonding layer precursor 301. The bonding layer 300 is positioned generally between the upper substrate 200 and the lower substrate 400 and directly contacting the upper substrate 200 and lower substrate 400. While one substrate is referred to herein as the "upper substrate" and the other substrate is referred to herein as the "lower substrate," the two substrates need not necessarily be arranged above and below one another, and the nomenclature of "upper" and "lower" is merely representative of the relative positioning in the upper substrate 200 and lower substrate 400 as depicted in the drawings described herein. Additionally, it should be understood herein that any feature of the upper substrate 200 may be included in the lower substrate 400, and vice versa. Generally, the lower substrate 400 and the upper substrate 200 each comprise bonding surfaces, referred to as the lower substrate bonding surface 402 and upper substrate bonding surface 202, respectively. The lower substrate bonding surface 402 and upper substrate bonding surface 202 may be referred to as "complementary" herein, meaning that the two bonding surfaces generally have geometries making them suitable for bonding with one another, such as with a bonding layer 300 as described in embodiments herein.

In one embodiment, the lower substrate 400 may comprise a lower substrate body 420 and a lower substrate surface member 410. The lower substrate surface member 410 may be positioned on a surface of the lower substrate body 420 and may comprise a lower substrate bonding surface 402. In one embodiment, the lower substrate bonding surface 402 may be substantially planar and may generally comprise a plurality of microchannels 490.

The lower substrate body 420 may comprise a wide variety of materials, including, but not limited to, metals such as copper, aluminum, nickel, or combinations thereof. In embodiments, the lower substrate body 420 may comprise at least about 50 wt % copper, at least about 60 wt % copper, at least about 70 wt % copper, at least about 80 wt % copper, at least about 90 wt % copper, at least about 95 wt % copper, at least about 99 wt % copper, at least about 99.5 wt % copper, at least about 50 wt % aluminum, at least about 60 wt % aluminum, at least about 70 wt % aluminum, at least about 80 wt % aluminum, at least about 90 wt % aluminum, at least about 95 wt % aluminum, at least about 99 wt % aluminum, at least about 99.5 wt % aluminum, at least about 50 wt % nickel, at least about 60 wt % nickel, at least about 70 wt % nickel, at least about 80 wt % nickel, at least about 90 wt % nickel, at least about 95 wt % nickel, at least about 99 wt % nickel, and/or at least about 99.5 wt % nickel. For example, the lower substrate body 420 may comprise a heat sink for a power electronic device. In other embodiments, the lower substrate body 420 may comprise non-metals such as, but not limited to, metal oxides, metal nitrides, metal carbides, or combinations thereof, including, but not limited to, alumina, beryllium oxide, aluminum nitride, silicon carbide, or combinations thereof. For example, the lower substrate body 420 may comprise a die for a power electronic device. In embodiments, the lower substrate body 420 may comprise at least about 50 wt % metal oxides, at least about 60 wt % metal oxides, at least about 70 wt % metal oxides, at least about 80 wt % metal oxides, at least about 90 wt % metal oxides, at least about 95 wt % metal oxides, at least about 99 wt % metal oxides, at least about 99.5 wt % metal oxides, at least about 50 wt % metal nitrides, at least about 60 wt % metal nitrides, at least about 70 wt % metal nitrides, at least about 80 wt % metal nitrides, at least about 90 wt % metal nitrides, at least about 95 wt % metal nitrides, at least about 99 wt % metal nitrides, at least about 99.5 wt % metal nitrides, at least about 50 wt % metal carbides, at least about 60 wt % metal carbides, at least about 70 wt % metal carbides, at least about 80 wt % metal carbides, at least about 90 wt % metal carbides, at least about 95 wt % metal carbides, at least about 99 wt % metal carbides, and/or at least about 99.5 wt % metal carbides.

Figure 3:
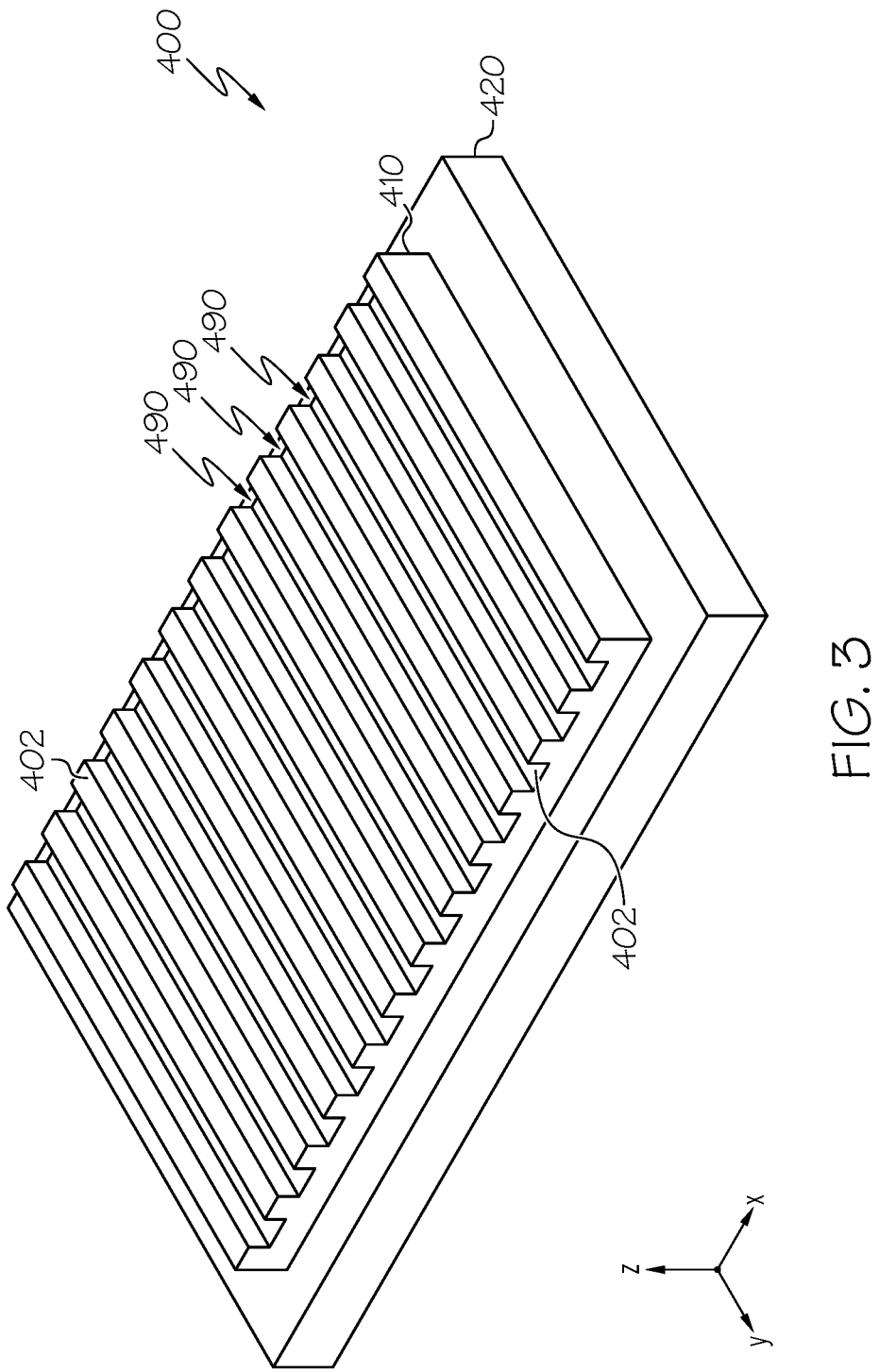
FIG. 3 schematically depicts a perspective view of a substrate, according to one or more embodiments shown and described herein.

The lower substrate surface member 410 is generally attached to the lower substrate body 420 and comprises a lower substrate bonding surface 402. The lower substrate bonding surface 402 comprises a plurality of microchannels 490. The microchannels 490 may be formed in the surface of the lower substrate bonding surface 402, as shown in FIG. 3. In one embodiment, the lower substrate surface member 410 may comprise one or more metals such as, but not limited to, copper, aluminum, nickel, or combinations thereof. In embodiments, the lower substrate surface member 410 may comprise at least about 50 wt % copper, at least about 60 wt % copper, at least about 70 wt % copper, at least about 80 wt % copper, at least about 90 wt % copper, at least about 95 wt % copper, at least about 99 wt % copper, at least about 99.5 wt % copper, at least about 50 wt % aluminum, at least about 60 wt % aluminum, at least about 70 wt % aluminum, at least about 80 wt % aluminum, at least about 90 wt % aluminum, at least about 95 wt % aluminum, at least about 99 wt % aluminum, at least about 99.5 wt % aluminum, at least about 50 wt % nickel, at least about 60 wt % nickel, at least about 70 wt % nickel, at least about 80 wt % nickel, at least about 90 wt % nickel, at least about 95 wt % nickel, at least about 99 wt % nickel, and/or at least about 99.5 wt % nickel. The composition of the lower substrate surface member 410 at the lower substrate bonding surface 402 may be any of the material compositions disclosed herein.

The geometry of the lower substrate bonding surface 402 generally comprises a plurality of microchannels 490. In one embodiment, the microchannels 490 may generally comprise a length component, a width component, and a depth component. Referring to FIG. 3, in one embodiment, the microchannels 490 may generally comprise a length component in the y-coordinate direction, a width component in the x-coordinate direction, and a depth component in the z-coordinate direction. The microchannels 490 may generally be positioned along the lower substrate bonding surface 402, such as linearly arranged in one embodiment, where the length of the lower substrate bonding surface 402 is substantially parallel to the lower substrate bonding surface 402.

FIG. 4 depicts and enlarged cross-sectional view of the microchannels 490 of the embodiment of FIG. 1. The microchannels 490 have a microchannel height 460 and a microchannel width 450. As used herein, the microchannel height 460 is measured from the deepest part of the microchannels 490 and the microchannel width 450 is measured as the greatest distance between sides of microchannels 490.

The length of each microchannel 490 may be greater than or equal to about 1 micron, 5 microns, 50 microns, 100 microns, 500 microns, 1000 microns, 5 mm, 10 mm or even greater than about 20 mm. In embodiments, the length of each microchannel 490 may be from about 1 micron to about 50 mm, from about 3 microns to about 20 mm, from about 50 microns to about 15 mm, from about 200 microns to about 15 mm, or from about 1000 microns to about 12 mm. The depth of the microchannels 490 may be greater than about 1 micron, greater than about 2 microns, greater than about 5 microns, greater than about 10 microns, greater than about 20 microns, or even greater than about 50 microns. In embodiments, the depth of the microchannels 490 may be from about 1 micron to about 50 microns, from about 5 microns to about 50 microns, from about 2 microns to about 25 microns, from about 3 microns to about 15 microns, or from about 5 microns to about 10 microns. The width of the microchannels 490 may be greater than about 1 micron, greater than about 2 microns, greater than about 5 microns, greater than about 10 microns, greater than about 20 microns, or even greater than about 50 microns. In embodiments, the width of the microchannels 490 may be from about 1 micron to about 50 microns, from about 2 microns to about 25 microns, from about 3 microns to about 15 microns, or from about 5 microns to about 10 microns. The ratio of the length to the depth of each microchannels 490 may be at least about 5:1, at least about 10:1, at least about 15:1, at least about 20:1, at least about 50:1, at least about 100:1, or even at least about 250:1. The microchannels 490 may comprise a microchannel spacing 470 defined by the distance between adjacent microchannels 490. The average microchannel spacing is defined by the average distance between adjacent microchannels 490. The average microchannel spacing may be from about be from about 1 micron to about 50 microns, from about 2 microns to about 25 microns, from about 3 microns to about 15 microns, or from about 5 microns to about 10 microns.

Figure 6:
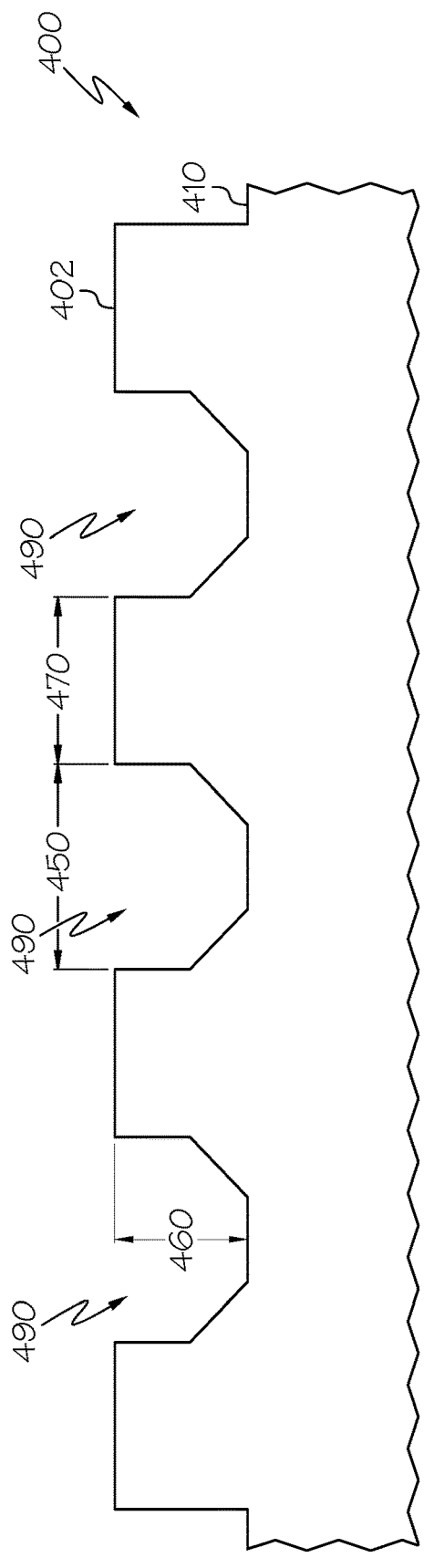
FIG. 6 schematically depicts a cross-sectional side view of a substrate bonding surface comprising microchannels with pentagonal cross-section, according to one or more embodiments shown and described herein.
Figure 7C:
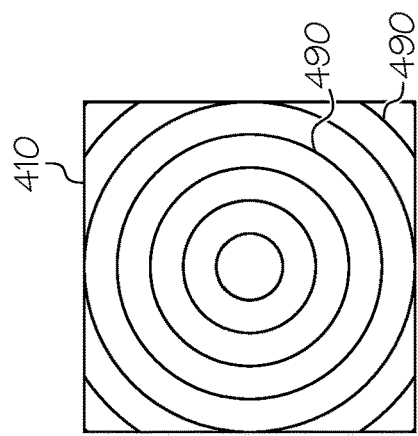
FIG. 7C schematically depicts a top view of a substrate bonding surface comprising circularly arranged microchannels 490, according to one or more embodiments shown and described herein.
Figure 7B:
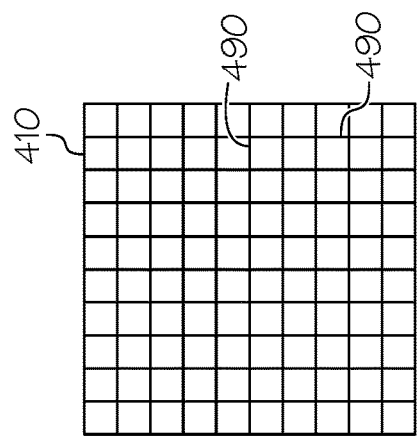
FIG. 7B schematically depicts a top view of a substrate bonding surface comprising crisscrossing linear microchannels 490, according to one or more embodiments shown and described herein.
Figure 7A:
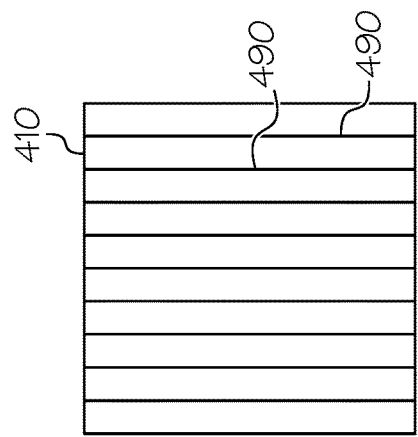
FIG. 7A schematically depicts a top view of a substrate bonding surface comprising linearly arranged parallel microchannels 490, according to one or more embodiments shown and described herein.

In embodiments, the microchannels 490 may have a wide variety of cross-sectional shapes. For example, FIG. 4 depicts substantially rectangular-shaped microchannels 490, FIG. 5 depicts substantially curved-shaped microchannels 490, and FIG. 6 depicts substantially pentagonal-shaped microchannels 490. It should be understood that the microchannels 490 may have substantially any shaped cross section. Additionally, as shown in FIGS. 7A, 7B, and 7C, the microchannels 490 may comprise a variety of patterns on the lower substrate bonding surface 402. For example, FIG. 7A depicts a pattern with substantially straight microchannels 490 that are substantially parallel relative to one another, FIG. 7B depicts a pattern with substantially straight microchannels 490 that crisscross at about a 90° angle (other angles of intersection are contemplated herein), and FIG. 7C depicts a pattern with substantially circular microchannels 490 that form a "bull-eye" configuration.

The lower substrate surface member 410 comprises a thickness 430 which is measured as the maximum thickness of the lower substrate surface member 410 in the direction substantially perpendicular to the planar lower substrate bonding surface 402 from the lower substrate body 420 to the bonding layer 300. The thickness 430 may at least about 5 microns, at least about 10 microns, at least about 20 microns, at least about 50 microns, at least about 100 microns, or at even at least about 200 microns. In additional embodiments, the thickness 430 may be less than about 200 microns, less than about 100 microns, less than about 50 microns, less than about 20 microns, less than about 10 microns, or even less than about 5 microns. In embodiments, the thickness 430 may be from about 10 microns to about 100 microns, from about 10 microns to about 300 microns, or from about 5 microns to about 400 microns. The lower substrate surface member 410 comprises a thickness 440 which is measured as the minimum thickness of the lower substrate surface member 410 in the direction substantially perpendicular to the planar lower substrate bonding surface 402 from the lower substrate body 420 to the bonding layer 300 (i.e., at the bottom of the microchannels 490. The thickness 440 may at least about 5 microns, at least about 10 microns, at least about 20 microns, at least about 50 microns, at least about 100 microns, or at even at least about 200 microns. In additional embodiments, the thickness 440 may be less than about 200 microns, less than about 100 microns, less than about 50 microns, less than about 20 microns, less than about 10 microns, or even less than about 5 microns. In embodiments, the thickness 430 may be from about 10 microns to about 100 microns, from about 10 microns to about 300 microns, or from about 5 microns to about 400 microns.

In one embodiment, the lower substrate surface member 410 may comprise a direct bonded metal, such as, but not limited to, direct bonded copper (DBC) or direct bonded aluminum (DBA). For example, direct bonded metallic layer may be bonded to the lower substrate body 420 by a high-temperature oxidation process where the copper and the lower substrate body 420 are heated to a controlled temperature in an atmosphere of nitrogen containing about 30 ppm of oxygen to form a copper-oxygen eutectic. In one embodiment, the microchannels 490 may be formed by an etching process. Any suitable etching process may be employed, such as acid chemical etching or laser etching. The microchannel patterns, such as those depicted in FIGS. 7A, 7B, and 7C may be etched with appropriately patterned etching masks. In another embodiment, the lower substrate surface member 410 may comprise a material that is metal plated on the lower substrate bonding surface 402, such as a nickel plated lower substrate bonding surface 402.

In another embodiment, the lower substrate surface member 410 may comprise pores which act as microchannels. The lower substrate surface member 410 may comprise a material having a porous structure comprising pores with average pore size of from about 1 micron to about 20 microns, from about 3 microns to about 15 microns, or from about 5 microns to about 10 microns. The lower substrate surface member 410 may have from about 30% porosity to about 70% porosity, or from about 40% to about 60% porosity.

The upper substrate 200 may comprise an upper substrate body 220 and an upper substrate surface member 210. The upper substrate surface member 210 may be positioned on a surface of the upper substrate body 220 and may comprise an upper substrate bonding surface 202. In one embodiment, the upper substrate body 220 may be substantially planar and may generally comprise a plurality of microchannels 290.

The upper substrate body 220 may comprise a wide variety of materials, including, but not limited to, metals such as copper, aluminum, nickel, and combinations thereof. In embodiments, the upper substrate body 220 may comprise at least about 50 wt % copper, at least about 60 wt % copper, at least about 70 wt % copper, at least about 80 wt % copper, at least about 90 wt % copper, at least about 95 wt % copper, at least about 99 wt % copper, at least about 99.5 wt % copper, at least about 50 wt % aluminum, at least about 60 wt % aluminum, at least about 70 wt % aluminum, at least about 80 wt % aluminum, at least about 90 wt % aluminum, at least about 95 wt % aluminum, at least about 99 wt % aluminum, at least about 99.5 wt % aluminum, at least about 50 wt % nickel, at least about 60 wt % nickel, at least about 70 wt % nickel, at least about 80 wt % nickel, at least about 90 wt % nickel, at least about 95 wt % nickel, at least about 99 wt % nickel, and/or at least about 99.5 wt % nickel. For example, the upper substrate body 220 may comprise a heat sink for a power electronic device. In other embodiments, the upper substrate body 220 may comprise non-metal material such as, but not limited to, metal oxides, metal nitrides, metal carbides, or combinations thereof, including, but not limited to, alumina, beryllium oxide, aluminum nitride, silicon carbide, or combinations thereof. For example, the upper substrate body 220 may comprise a die for a power electronic device. In embodiments, the upper substrate body 220 may comprise at least about 50 wt % metal oxides, at least about 60 wt % metal oxides, at least about 70 wt % metal oxides, at least about 80 wt % metal oxides, at least about 90 wt % metal oxides, at least about 95 wt % metal oxides, at least about 99 wt % metal oxides, at least about 99.5 wt % metal oxides, at least about 50 wt % metal nitrides, at least about 60 wt % metal nitrides, at least about 70 wt % metal nitrides, at least about 80 wt % metal nitrides, at least about 90 wt % metal nitrides, at least about 95 wt % metal nitrides, at least about 99 wt % metal nitrides, at least about 99.5 wt % metal nitrides, at least about 50 wt % metal carbides, at least about 60 wt % metal carbides, at least about 70 wt % metal carbides, at least about 80 wt % metal carbides, at least about 90 wt % metal carbides, at least about 95 wt % metal carbides, at least about 99 wt % metal carbides, and/or at least about 99.5 wt % metal carbides.

The upper substrate surface member 210 is generally attached to the upper substrate body 220 and comprises an upper substrate bonding surface 202. The upper substrate bonding surface 202 comprises a plurality of microchannels 290. The microchannels 290 may be formed in the upper substrate bonding surface 202 of the upper substrate surface member 210, similar to as shown in FIG. 3. In one embodiment, the upper substrate surface member 210 may comprise one or more metals such as, but not limited to, copper, aluminum, nickel, or combinations thereof. In embodiments, the upper substrate surface member 210 may comprise at least about 50 wt % copper, at least about 60 wt % copper, at least about 70 wt % copper, at least about 80 wt % copper, at least about 90 wt % copper, at least about 95 wt % copper, at least about 99 wt % copper, at least about 99.5 wt % copper, at least about 50 wt % aluminum, at least about 60 wt % aluminum, at least about 70 wt % aluminum, at least about 80 wt % aluminum, at least about 90 wt % aluminum, at least about 95 wt % aluminum, at least about 99 wt % aluminum, at least about 99.5 wt % aluminum, at least about 50 wt % nickel, at least about 60 wt % nickel, at least about 70 wt % nickel, at least about 80 wt % nickel, at least about 90 wt % nickel, at least about 95 wt % nickel, at least about 99 wt % nickel, and/or at least about 99.5 wt % nickel.

It should be understood that an aspect of the lower substrate 400 disclosed herein may be included in the upper substrate 200. For example, the characteristics of the microchannels 490 disclosed in FIGS. 3, 4, 5, 6, 7A, 7B, and 7C may be included in the upper substrate 200. The structures and accompanying description of FIGS. 3, 4, 5, 6, 7A, 7B, and 7C is equally applicable to the upper substrate 200 and lower substrate 400. Additionally, it should be understood the upper substrate 200, the lower substrate 400, or both, may include microchannels.

The upper substrate surface member 210 comprises a thickness 230 which is measured as the maximum thickness of the upper substrate surface member 210 in the direction substantially perpendicular to the planar upper substrate bonding surface 202. The thickness 230 may at least about 5 microns, at least about 10 microns, at least about 20 microns, at least about 50 microns, at least about 100 microns, or at even at least about 200 microns. In additional embodiments, the thickness 230 may be less than about 200 microns, less than about 100 microns, less than about 50 microns, less than about 20 microns, less than about 10 microns, or even less than about 5 microns. In embodiments, the thickness 230 may be from about 10 microns to about 100 microns, from about 10 microns to about 300 microns, or from about 5 microns to about 400 microns. The upper substrate surface member 210 comprises a thickness 240 which is measured as the minimum thickness of the upper substrate surface member 210 in the direction substantially perpendicular to the planar upper substrate bonding surface 202 from the upper substrate body 220 to the bonding layer 300 (i.e., at the bottom of the microchannels 290. The thickness 240 may at least about 5 microns, at least about 10 microns, at least about 20 microns, at least about 50 microns, at least about 100 microns, or at even at least about 200 microns. In additional embodiments, the thickness 240 may be less than about 200 microns, less than about 100 microns, less than about 50 microns, less than about 20 microns, less than about 10 microns, or even less than about 5 microns. In embodiments, the thickness 240 may be from about 10 microns to about 100 microns, from about 10 microns to about 300 microns, or from about 5 microns to about 400 microns.

In one embodiment, the upper substrate surface member 210 may comprise a direct bonded metal, such as, but not limited to, direct bonded copper (DBC) or direct bonded aluminum (DBA). For example, direct bonded metallic layer may be bonded to the upper substrate body 220 by a high-temperature oxidation process where the copper or aluminum and the upper substrate body 220 are heated to a controlled temperature in an atmosphere of nitrogen containing about 30 ppm of oxygen to form a copper-oxygen eutectic. In one embodiment, the microchannels 290 may be formed by an etching process. Any suitable etching process may be employed, such as acid chemical etching or laser etching. The microchannel patterns, such as those depicted in FIGS. 7A, 7B, and 7C may be etched with appropriately patterned etching masks. In another embodiment, the upper substrate surface member 210 may comprise a material that is metal plated on the upper substrate bonding surface 202, such as a nickel plated upper substrate bonding surface 202.

In another embodiment, the upper substrate surface member 210 may comprise pores which act as microchannels. The upper substrate surface member 210 may comprise a material having a porous structure comprising pores with average pore size of from about 1 micron to about 20 microns, from about 3 microns to about 15 microns, or from about 5 microns to about 10 microns. The upper substrate surface member 210 may have from about 30% porosity to about 70% porosity, or from about 40% to about 60% porosity.

As shown in FIG. 1, prior to bonding, a bonding layer precursor 301 is positioned between the upper substrate 200 and the lower substrate 400. The bonding layer precursor 301 may comprise a first surface 306 and a second surface 308, where the distance between the first surface 306 and second surface 308 defines a thickness 304 of the bonding layer precursor 301. The bonding layer precursor 301 may be substantially planar. In one embodiment, the bonding layer precursor 301 is a solid metallic foil. The thickness 304 of the bonding layer precursor 301 may be from about 5 microns to about 100 microns, from about 10 microns to about 50 microns, or from about 15 microns to about 30 microns. In one embodiment, the bonding layer precursor 301 may comprise tin, such as at least about at least about 50 wt % tin, at least about 60 wt % tin, at least about 70 wt % tin, at least about 80 wt % tin, at least about 90 wt % tin, at least about 95 wt % tin, at least about 99 wt % tin.

Referring now to FIGS. 1 and 2, through a heating process, the bonding layer precursor 301 becomes the bonding layer 300. The bonding layer 300 bonds the upper substrate 200 with the lower substrate 400. The bonding layer 300 may securely attach the lower substrate 400 to the upper substrate 200. As such, the bonding layer precursor 301 may generally comprise the same composition as the bonding layer 300, and the materials of the bonding layer precursor 301 and bonding layer 300 (excluding the materials formed at the bonding interface by inter-metallic bonding, e.g., materials of a formed eutectic systems) may be interchangeably used herein. The heat treatment may be at a temperature of at least about the melting point of the material of the bonding layer precursor 301, but may be at a temperature below the melting point of the material of the upper substrate 200 and lower substrate 400. The materials of the upper substrate 200 and lower substrate 400 may generally have a higher melting point than the material of the bonding layer 300. Upon heating, the bonding layer precursor 301 melts to form the bonding layer 300, where the bonding layer 300 fills the microchannels 290 of the upper substrate bonding surface 202 and the microchannels 490 of the lower substrate bonding surface 402. By substantially filling the microchannels 290, 490, the bonding layer 300 may contact substantially the entire upper substrate bonding surface 202 and/or lower substrate bonding surface 402. As shown in FIG. 1, empty area 310 in the microchannels 290, 4290 is filled with the bonding layer 300 in FIG. 2. Without being bound by theory, it is believed that bonding is improved between the bonding layer 300 and the upper substrate 200 and/or lower substrate 400 by capillary action caused by the microchannels 290, 490. In general, capillary action (sometimes referred to as capillarity, capillary motion, or wicking) is the ability of a liquid to flow in narrow spaces without the assistance of, and in opposition to, external forces like gravity. It occurs because of intermolecular forces between the liquid and surrounding solid surfaces. The geometry of the microchannels 290, 490 may allow for capillary action between the melted material of the bonding layer 300 and the edges of the microchannels 290, 490.

In another embodiment, the bonding layer precursor 301 may comprise a plurality of metal particles in a binder matrix. The metal particles may be from about 1 micron to about 100 microns in diameter, and may be substantially spherical in shape. The binder may be a polymer binder which burns out of the bonding layer precursor 301 when heated to melt the metal particles. The metal particles may comprise tin.

In some embodiments, the materials of the upper substrate 200 and/or lower substrate 400 may have melting points of at least about 300° C., at least about 400° C., at least about 500° C., at least about 600° C., at least about 800° C., or even at least about 1000° C. The material of the bonding layer 300 may have a melting point of less than about 300° C., less than about 275° C., less than about 250° C., or even less than about 240° C. For example, in a system with a tin bonding layer 300 and copper upper substrate surface member 210 and lower substrate surface member 410, the tin may have a melting point of about 232° C. and the copper may have a melting point of about 1085° C. In such an embodiment, the heat treatment for bonding may be greater than about 250° C. but less than about 1000° C., such as from about 250° C. to about 300° C. The heating time may be any suitable time for melting of the bonding layer precursor 301, such as about 15 minutes to about several hours. The heating may be in a vacuum environment or in air. In embodiments, the material or materials of the upper substrate 200 and/or lower substrate 400 may have a melting point that is greater than the melting point of one or more components of the bonding layer 300. For example, the material or materials of the upper substrate 200 and/or lower substrate 400 may have a melting point of at least about 50° C. greater, at least about 100° C. greater, at least about 200° C. greater, or even at least about 400° C. greater than the material of the bonding layer 300.

In one embodiment, no wetting agent is needed for bonding of the bonding layer 300 to the upper substrate 200 and/or lower substrate 400. A wetting agent may be employed in conventional bonding techniques. However, without being bound by theory, it is believed that the microchannels 290, 490 promote capillary action of the material of the bonding layer 300, so a wetting agent may not be necessary for some embodiment described herein.

Upon heating, inter-metallic bonds are formed between the bonding layer 300 and the upper substrate 200 and lower substrate 400 at the upper substrate bonding surface 202 and lower substrate bonding surface 402, respectively. The bond formed in the present embodiments between the bonding layer 300 and the upper substrate 200 and/or the lower substrate 400 may be stronger than conventional bonds where no microchannels 290, 490 are present. Without being bound by theory, it is believed that the bond may be stronger because of the increased surface area of inter-metallic bonding due to the microchannels 290, 490. Additionally, depending upon the heating temperature utilized, a selected weight ratio of bonding layer 300 to upper substrate surface member 210 and lower substrate surface member 410 may be utilized. The weight ratio of materials of the bonding layer 300 to the sum of the materials of the upper substrate surface member 210 and lower substrate surface member 410 may form selected eutectics systems. For example, for a copper and tin system at about 250° C., a weight ratio of 30% copper and 70% tin may be utilized to form a desired eutectic system. In embodiments, the weight ratio of the bonding layer 300 to the upper substrate surface member 210 and lower substrate surface member 410 may be about 2:8, about 3:7, about 4:6, from about 2:8 to about 4:6, or from about 2.5:7.5 to about 3.5:6.5. Furthermore, it is believed that the geometry of the microchannels 290, 490 may improve durability of the bond. As the bond is thermally cycled, sometimes above the melting point of the material of the bonding layer 300, the eutectic system may re-form each cycle with additional material of the upper substrate surface member 210 and/or lower substrate surface member 410. The geometry of the microchannels 290, 490 may promote formation of the eutectic system between the microchannels 290, 490 without reacting through the entire thickness 230 of the upper substrate surface member 210 or thickness 430 of the lower substrate surface member 410.

The resulting bonded substrates are spaced by a bond distance 330, which is the distance between the upper substrate bonding surface 202 and the lower substrate bonding surface 402. In embodiments, the bond distance 330 may be from about 5 microns to about 1000 microns, from about 10 microns to about 100 microns, or from about 15 microns to about 30 microns.

Figure 8:
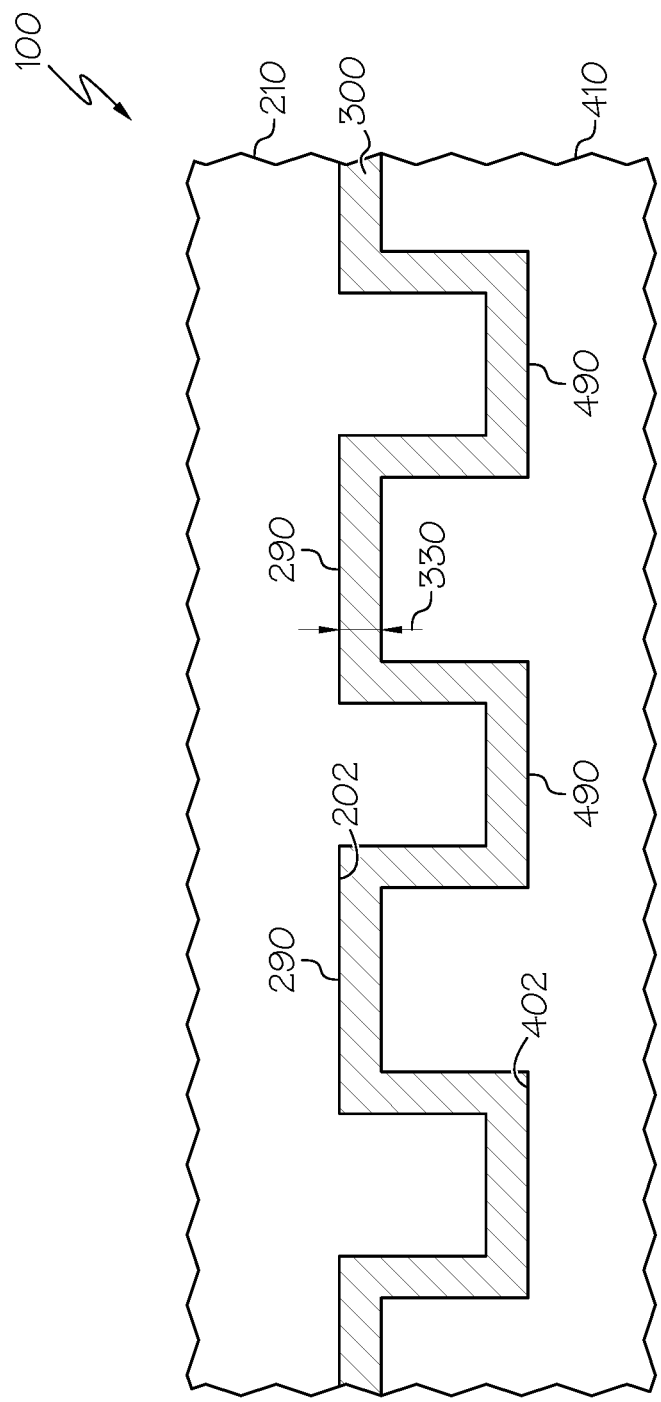
FIG. 8 schematically depicts a cross-sectional side view of two substrates bonded to one another with a bonding layer, according to one or more embodiments shown and described herein.

In some embodiments, as shown in FIG. 1, the microchannels 290, 490 of the upper substrate 200 and the lower substrate 400 may be in substantial alignment. However, in other embodiments, as shown in FIG. 8, the microchannels 290, 490 may have complementary alignments and geometries relative to one another.

As described herein, microchannels formed on the surfaces of substrates may promote more secure and durable bonds between substrates. Additionally, compared to conventional bonding procedures, processing times may be reduced and additional wetting agents may not be necessary. The bond may be suitable for thermal cycling at relatively high temperatures while having good thermal conductivity characteristics.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A system of bonded substrates, the system comprising:
a first substrate comprising a bonding surface, wherein a geometry of the bonding surface of the first substrate comprises a plurality of microchannels;
a second substrate comprising a complementary bonding surface;
a bonding layer positioned between the first substrate and the second substrate, wherein the bonding layer fills the microchannels of the first substrate and directly contacts substantially the entire bonding surface of the first substrate, wherein the bonding layer comprises a metal.

2. The system of claim 1, wherein:
a geometry of the complementary bonding surface of the second substrate comprises a plurality of microchannels; and
the bonding layer fills the microchannels of the complementary bonding surface of the second substrate and contacts substantially the entire complementary bonding surface of the second substrate.

3. The system of claim 1, wherein the bonding layer comprises tin.

4. The system of claim 1, wherein the depth of each microchannel is from about 5 microns to about 10 microns.

5. The system of claim 1, wherein the bonding surface of the first substrate comprises a metal chosen from aluminum, nickel, copper, or combinations thereof.

6. The system of claim 5, wherein the metal of the bonding surface of the first substrate is a direct bonded metal and the microchannels are formed by etching.

7. The system of claim 1, wherein at least one material of the first substrate has a melting point greater than a melting point of the metal of the bonding layer.

8. A system of bonded substrates, the system comprising:
a first substrate comprising a bonding surface, wherein a geometry of the bonding surface of the first substrate comprises a plurality of microchannels;
a second substrate comprising a complementary bonding surface;
a bonding layer positioned between the first substrate and the second substrate, wherein the bonding layer fills the microchannels of the first substrate and directly contacts substantially the entire bonding surface of the first substrate, wherein the bonding layer comprises a metal; wherein:
a geometry of the complementary bonding surface of the second substrate comprises a plurality of microchannels; and
the bonding layer fills the microchannels of the complementary bonding surface of the second substrate and contacts substantially the entire complementary bonding surface of the second substrate; and the depth of each microchannel is from about 5 microns to about 10 microns.

9. The system of claim 8, wherein the bonding layer comprises tin.

10. The system of claim 8, wherein the bonding surface of the first substrate comprises a metal chosen from aluminum, nickel, copper, or combinations thereof.

11. The system of claim 10, wherein the metal of the bonding surface of the first substrate is a direct bonded metal and the microchannels are formed by etching.

12. The system of claim 8, wherein at least one material of the first substrate has a melting point greater than a melting point of the metal of the bonding layer.

13. The system of claim 8, wherein each of the microchannels of the first substrate comprise a length and a depth, the length substantially parallel with the bonding surface of the first substrate, and wherein the ratio of the length to the depth is at least about 10:1.

14. The system of claim 1, wherein the plurality of microchannels are spaced apart from one another such that one or more portions of the bonding surface of the first substrate are the microchannels and other portions of the bonding surface are positioned between the microchannels.

15. The system of claim 8, wherein the plurality of microchannels are spaced apart from one another such that one or more portions of the bonding surface of the first substrate are the microchannels and other portions of the bonding surface are positioned between the microchannels.

16. A system of bonded substrates, the system comprising:
a first substrate comprising a bonding surface, wherein a geometry of the bonding surface of the first substrate comprises a plurality of microchannels;
a second substrate comprising a complementary bonding surface;
a bonding layer positioned between the first substrate and the second substrate, wherein the bonding layer fills the microchannels of the first substrate and directly contacts substantially the entire bonding surface of the first substrate, wherein the bonding layer comprises a metal;
wherein each of the microchannels of the first substrate comprise a length and a depth, the length substantially parallel with the bonding surface of the first substrate, and wherein the ratio of the length to the depth is at least about 10:1.

17. The system of claim 16, wherein:
a geometry of the complementary bonding surface of the second substrate comprises a plurality of microchannels; and
the bonding layer fills the microchannels of the complementary bonding surface of the second substrate and contacts substantially the entire complementary bonding surface of the second substrate.

18. The system of claim 16, wherein the bonding layer comprises tin.

19. The system of claim 16, wherein the depth of each microchannel is from about 5 microns to about 10 microns.

20. The system of claim 1, wherein the bonding surface of the first substrate comprises a metal chosen from aluminum, nickel, copper, or combinations thereof.

* * * * *